US011688467B2

(12) United States Patent
Chen et al.

(10) Patent No.: US 11,688,467 B2
(45) Date of Patent: *Jun. 27, 2023

(54) DEFECT DETECTION IN MEMORIES WITH TIME-VARYING BIT ERROR RATE

(71) Applicant: Micron Technology, Inc., Boise, ID (US)

(72) Inventors: Zhengang Chen, San Jose, CA (US); Sai Krishna Mylavarapu, Folsom, CA (US); Zhenlei Shen, Milpitas, CA (US); Tingjun Xie, Milpitas, CA (US); Charles S. Kwong, Redwood City, CA (US)

(73) Assignee: Micron Technology, Inc., Boise, ID (US)

( * ) Notice: Subject to any disclaimer, the term of this patent is extended or adjusted under 35 U.S.C. 154(b) by 36 days.

This patent is subject to a terminal disclaimer.

(21) Appl. No.: 17/347,570

(22) Filed: Jun. 14, 2021

(65) Prior Publication Data

US 2021/0304826 A1 Sep. 30, 2021

Related U.S. Application Data

(63) Continuation of application No. 16/215,267, filed on Dec. 10, 2018, now Pat. No. 11,037,637.

(51) Int. Cl.
*G11C 16/34* (2006.01)
*G11C 29/52* (2006.01)
(Continued)

(52) U.S. Cl.
CPC ........ *G11C 16/3404* (2013.01); *G06F 11/076* (2013.01); *G06F 11/1048* (2013.01);
(Continued)

(58) Field of Classification Search
CPC ..... G11C 16/3404; G11C 16/26; G11C 29/42; G11C 29/44; G11C 29/52;
(Continued)

(56) References Cited

U.S. PATENT DOCUMENTS 6,633,451 B1 * 10/2003 Chainer ............. G11B 5/59633
360/75
10,101,931 B1 * 10/2018 Camp ................. G06F 12/0866
(Continued)

OTHER PUBLICATIONS

International Search Report for International Application No. PCT/US2019/065380, dated Apr. 8, 2020, 11 pages.

*Primary Examiner* — James C Kerveros
(74) *Attorney, Agent, or Firm* — Lowenstein Sandler LLP

(57) ABSTRACT

Described herein are embodiments related to defect detection in memory components of memory systems with time-varying bit error rate. A processing device determines that a bit error rate (BER) corresponding to a read operation to read a unit of data in a memory component satisfies a threshold criterion, determines a write-to-read (W2R) delay for the read operation, wherein the W2R delay comprises a difference between a time of the read operation and a write timestamp indicating when the unit of data was written to the memory component, and determines whether the W2R delay is within a W2R delay range corresponding to an initial read voltage level used by the read operation to read the unit of data. The processing device initiates a defect detection operation responsive to the W2R delay being within the W2R delay range, the defect detection operation to detect time-varying defects in the memory component.

20 Claims, 6 Drawing Sheets

(51) Int. Cl.
*G06F 11/10* (2006.01)
*G11C 16/26* (2006.01)
*G11C 29/42* (2006.01)
*G06F 11/07* (2006.01)
*G06F 11/14* (2006.01)
*G11C 29/44* (2006.01)
*G11C 29/04* (2006.01)

(52) U.S. Cl.
CPC ........ *G06F 11/1068* (2013.01); *G06F 11/141* (2013.01); *G11C 16/26* (2013.01); *G11C 29/42* (2013.01); *G11C 29/44* (2013.01); *G11C 29/52* (2013.01); *G06F 2201/81* (2013.01); *G11C 2029/0411* (2013.01)

(58) Field of Classification Search
CPC ............ G11C 2029/0411; G11C 16/32; G11C 2029/0409; G11C 29/50012; G11C 29/4401; G11C 29/1201; G06F 11/076; G06F 11/1048; G06F 11/1068; G06F 11/141; G06F 2201/81; G06F 11/073; G06F 2201/835
USPC .......................................................... 714/764
See application file for complete search history.

(56) References Cited

U.S. PATENT DOCUMENTS

| | | |
|---|---|---|
| 10,446,255 B2 | 10/2019 | Chinnakkonda Vidyapoornachary et al. |
| 2004/0240299 A1* | 12/2004 | Fujimoto .............. G11C 11/406 365/222 |
| 2005/0081085 A1 | 4/2005 | Ellis et al. |
| 2005/0229065 A1* | 10/2005 | Kai .................... G01R 31/3016 714/742 |
| 2010/0005281 A1 | 1/2010 | Buchmann et al. |
| 2012/0268994 A1 | 10/2012 | Nagashima |
| 2014/0223256 A1 | 8/2014 | Sakai et al. |
| 2015/0332735 A1 | 11/2015 | Chun et al. |
| 2016/0004458 A1 | 1/2016 | Micheloni et al. |
| 2016/0148702 A1 | 5/2016 | Karakulak et al. |
| 2016/0266973 A1 | 9/2016 | Abe |
| 2017/0162268 A1 | 6/2017 | Chen et al. |
| 2017/0269991 A1 | 9/2017 | Bazarsky et al. |
| 2017/0358369 A1 | 12/2017 | Chinnakkonda Vidyapoornachary et al. |
| 2018/0196713 A1 | 7/2018 | Lee et al. |
| 2018/0269901 A1 | 9/2018 | Lee et al. |
| 2019/0250843 A1 | 8/2019 | Ratnam et al. |

* cited by examiner

DEFECT DETECTION IN MEMORIES WITH TIME-VARYING BIT ERROR RATE

RELATED APPLICATIONS

This application is a continuation application of co-pending U.S. patent application Ser. No. 16/215,267, filed Dec. 10, 2018, which is herein incorporated by reference.

TECHNICAL FIELD

Embodiments of the disclosure relate generally to memory sub-systems, and more specifically, relate to defect detection in memory components of a memory sub-system with time-varying bit error rates.

BACKGROUND

A memory sub-system can be a storage system, such as a solid-state drive (SSD), or a hard disk drive (HDD). A memory sub-system can be a memory module, such as a dual in-line memory module (DIMM), a small outline DIMM (SO-DIMM), or a non-volatile dual in-line memory module (NVDIMM). A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
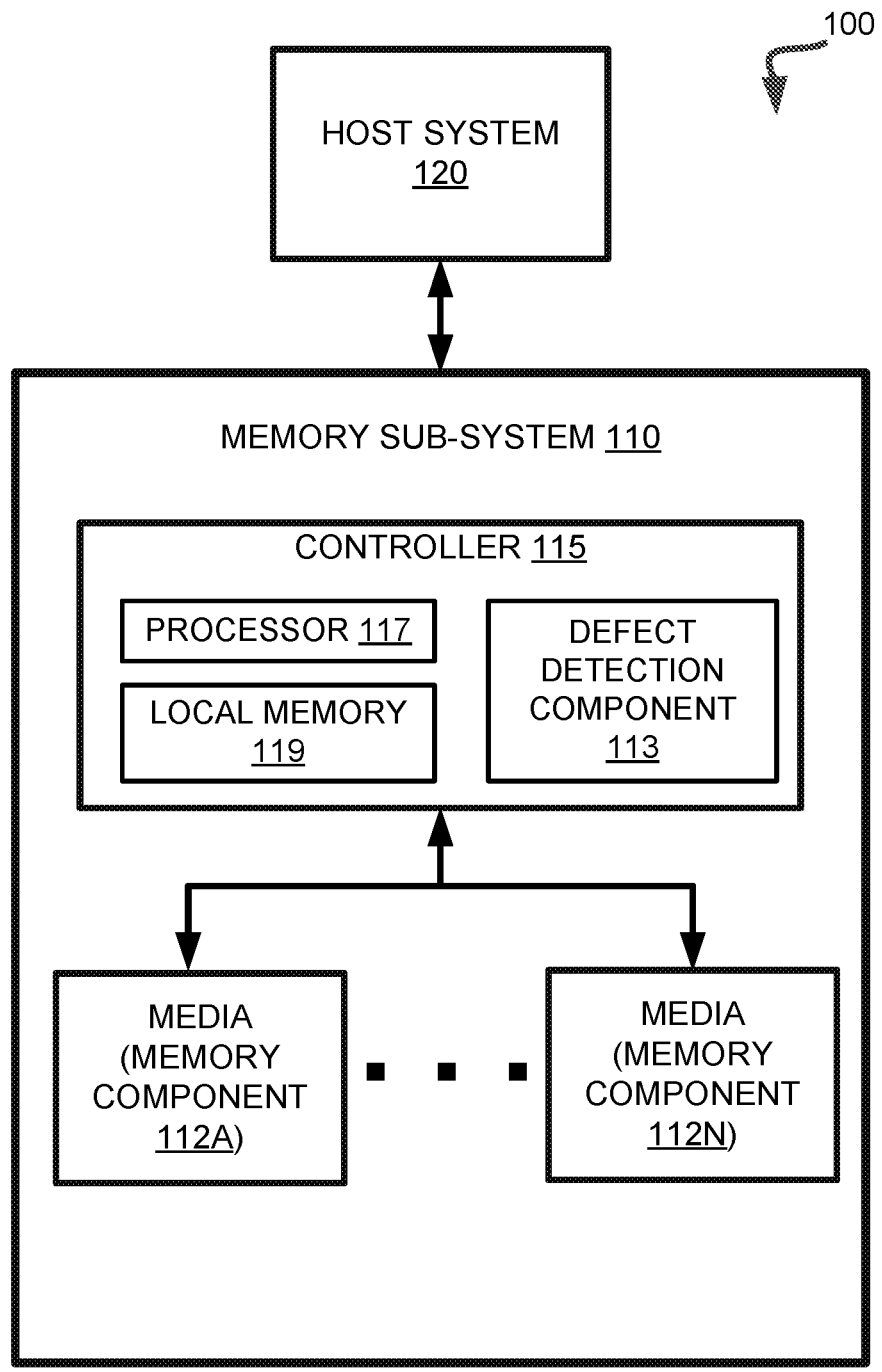
FIG. 1 illustrates an example computing environment that includes a memory sub-system in accordance with some embodiments of the present disclosure.

Aspects of the present disclosure are directed to defect detection in memory sub-systems with time-varying bit error rates (BER). A memory sub-system is also hereinafter referred to as a "memory device." An example of a memory sub-system is a storage device that is coupled to a central processing unit (CPU) via a peripheral interconnect (e.g., an input/output bus, a storage area network). Examples of storage devices include a solid-state drive (SSD), a flash drive, a universal serial bus (USB) flash drive, and a hard disk drive (HDD). Another example of a memory sub-system is a memory module that is coupled to the CPU via a memory bus. Examples of memory modules include a dual in-line memory module (DIMM), a small outline DIMM (SO-DIMM), a non-volatile dual in-line memory module (NVDIMM), etc. The memory sub-system can be, for instance, a hybrid memory/storage sub-system. In general, a host system can utilize a memory sub-system that includes one or more memory components. The host system can provide data to be stored at the memory sub-system and can request data to be retrieved from the memory sub-system.

The memory sub-system can include multiple memory components that can store data from the host system. Each memory component can include a different type of media. Examples of media include, but are not limited to, a cross-point array of non-volatile memory and flash based memory such as single-level cell (SLC) memory, triple-level cell (TLC) memory, and quad-level cell (QLC) memory. The characteristics of different types of media can be different from one media type to another media type. One example of a characteristic associated with a memory component is data density. Data density corresponds to an amount of data (e.g., bits of data) that can be stored per memory cell of a memory component. Using the example of a flash based memory, a quad-level cell (QLC) can store four bits of data while a single-level cell (SLC) can store one bit of data. Accordingly, a memory component including QLC memory cells will have a higher data density than a memory component including SLC memory cells. Another example of a characteristic of a memory component is access speed. The access speed corresponds to an amount of time for the memory component to access data stored at the memory component.

Other characteristics of a memory component can be associated with the endurance of the memory component to store data. When data is written to and/or erased from a memory cell of a memory component, the memory cell can be damaged. As the number of write operations and/or erase operations performed on a memory cell increases, the probability that the data stored at the memory cell including an error increases, and the memory cell is increasingly damaged. A characteristic associated with the endurance of the memory component is the number of write operations or a number of program/erase operations performed on a memory cell of the memory component. If a threshold number of write operations performed on the memory cell is exceeded, then data can no longer be reliably stored at the memory cell as the data can include a large number of errors that cannot be corrected. Different media types can also have difference endurances for storing data. For example, a first media type can have a threshold of 1,000,000 write operations, while a second media type can have a threshold of 2,000,000 write operations. Accordingly, the endurance of the first media type to store data is less than the endurance of the second media type to store data.

Another characteristic associated with the endurance of a memory component to store data is the total number of bytes written to a memory cell of the memory component. Similar to the number of write operations, as new data is written to the same memory cell of the memory component the memory cell is damaged and the probability that data stored at the memory cell includes an error increases. If the number of total bytes written to the memory cell of the memory component exceeds a threshold number of total bytes, then the memory cell can no longer reliably store data.

Another characteristic associated with a memory component is time-varying BER. In particular, some non-volatile memories (e.g., NAND, phase change, etc.) have threshold voltage (Vt) distributions that move as a function of time. With a same read level, if Vt distributions move, the BER changes. Given a Vt distribution at an instance in time, there is an optimal read level or optimal read level range that achieves a lowest bit error rate. In particular, the Vt distribution and BER can be a function of write-to-read (W2R) delay. Due to this time-varying nature of BER, as well as other noise mechanisms in memory, a single read level is not sufficient to achieve best memory read BER to meet some system reliability targets. A single read level, such as illustrated in three read levels of FIG. 4, achieves a low BER at short W2R delay but BER is high at longer delays. Multiple read levels, such as illustrated in FIG. 4, can be used in combination to achieve low BER at the entire range of W2R delay.

Non-volatile memory can have multiple noise mechanisms that increase BER, such a write wear, disturb, defect, or the like. However, during error recovery, read retry operations use different read levels to recover data. Read retry operations are used to achieve lowest BER. For memories with W2R delay dependent BER, read retry operations are also used to handle a wide range of W2R delays.

One particular problem in memory systems is how to detect grown defects. In particular, as the NVM based system operates through its life time, defect pages, defect blocks, and defect dies may grow. In order to detect such grown defects, especially read failure related grown defects, typically a test routine is invoked to make sure the high BER or even uncorrectable error correction code (UECC) events are not induced by transient errors. Such test routines can be invoked periodically to detect defects in the system. However, defects can grow and show up at any time during host access. This is especially true in a very high performance system where many accesses to the memory can occur between periodic defect test routines. Also, for memories with W2R delay dependent BER, high BER or read retry events can largely be caused by the workload, meaning the conventional criteria for triggering defect test routines can generate a lot of false alarms, hurting system performance. Conventional memory sub-systems typically do not have on-demand trigger criteria for such defect test routines.

Aspects of the present disclosure address the above and other deficiencies by providing on-demand trigger criteria for such defect test routines, based on metrics such as decoder statistics or based on read retry statistics, for memories with time-varying BER. In particular, the present disclosure includes an innovative approach for defect detection in memories with time-varying BER, in particular, with BER dependent on W2R delay. A write timestamp is written to the memory together with data for each write operation. After each read (possibly with error recovery flow), the system determines whether to trigger defect test routines based on the combination of its W2R delay and other stats, including decoder statistics and error recovery flow statistics. The present disclosure defines when a test routine can be involved to make sure the high BER or even UECC events are not induced by transient errors. These test routines can be invoked on-demand, as opposed to periodically as done conventionally. Also, the present disclosure addresses how to detect defects that grow and show up at any time during host access. Also, the present disclosure addresses how to reduce false alarms that hurt system performance, since the defects can be detected from other events that are largely caused by the workload. That is, the present disclosure minimizes false alarms and reduces performance penalty caused by defect management algorithms that are run periodically and triggered by events that are not associated with defects. As described herein, the on-demand criterion can apply to every read operation and can effectively detect abnormal high RBER events to trigger defect detection algorithms. The trigger criterion can be implemented in hardware, software, or any combination thereof impacting system performance.

In one implementation, a processing device performs a read operation to read a unit of data comprising data and a write timestamp indicating when the unit of data was written to the memory component. The processing device possibly performs an error recovery flow (ERF) to recover the unit of data responsive to one or more errors being detected in the read operation. The processing device determines whether to perform a defect detection operation to detect a defect in the memory component using a BER, corresponding to the read operation, and the write timestamp. In another embodiment, the processing device determines whether to perform a defect detection operation to detect a defect in the memory component using an indication of an ERF being performed (also referred to as ERF indicator) and the write timestamp. The ERF being performed can be an indication of a defect in the memory component as well. The processing device initiates the defect detection operation responsive to the write timestamp being within a specified range corresponding to an initial read voltage level of the read operation. Additional details of defect detection in memory components with time-varying BER are described in more detail below.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a defect detection component 113 that can be used to determine whether to perform a defect detection operation to detect a defect in a memory component using a BER or ERF indicator and a write timestamp in the unit of data, write timestamp indicating when the unit of data was written to the memory component. The defect detection component 113 can trigger a defect detection operation responsive to the BER satisfying the BER threshold and the calculated W2R (based on the write timestamp) is within the range of W2R delays specified for the initial read voltage level. In some embodiments, the controller 115 includes at least a portion of the defect detection component 113. For example, the controller 115 can include a processor 117 (processing device) configured to execute instructions stored in local memory 119 for performing the operations described herein. In some embodiments, the defect detection component 113 is part of the host system 120, an application, or an operating system.

The defect detection component 113 can determine whether the BER, corresponding to the read operation, satisfies a threshold criterion when unit of data is read from any one of the memory components 112A to 112N by the read operation with the initial read voltage level. Responsive to the BER satisfying the threshold criterion, the defect detection component 113 can initiate or otherwise perform the defect detection operation to detect the defect in the respective memory component using the BER, corresponding to the read operation, and the write timestamp. For example, after the unit of data is recovered, the defect detection component 113 can determine whether a re-read operation is performed in the ERF. The re-read operation is performed with a different read voltage level than an initial read voltage level used with an initial read operation before the ERF is performed. Responsive to the re-read operation being performed in the ERF, the defect detection component 113 can initiate or otherwise perform the defect detection operation to detect the defect in the memory component using the BER, corresponding to the read operation, and the write timestamp. In another embodiment, the defect detection component 113 can determine whether an ERF has been performed to satisfy a threshold criterion when unit of data is read from any one of the memory components 112A to 112N by the read operation with the initial read voltage level. Responsive to the ERF satisfying the threshold criterion, the defect detection component 113 can initiate or otherwise perform the defect detection operation to detect the defect in the respective memory component using the indication of the ERF and the write timestamp. For example, after the unit of data is recovered, the defect detection component 113 can determine whether a re-read operation is performed in the ERF. The re-read operation is performed with a different read voltage level than an initial read voltage level used with an initial read operation before the ERF is performed. Responsive to the re-read operation being performed in the ERF, the defect detection component 113 can initiate or otherwise perform the defect detection operation to detect the defect in the memory component using the indication of ERF and the write timestamp.

Figure 2:
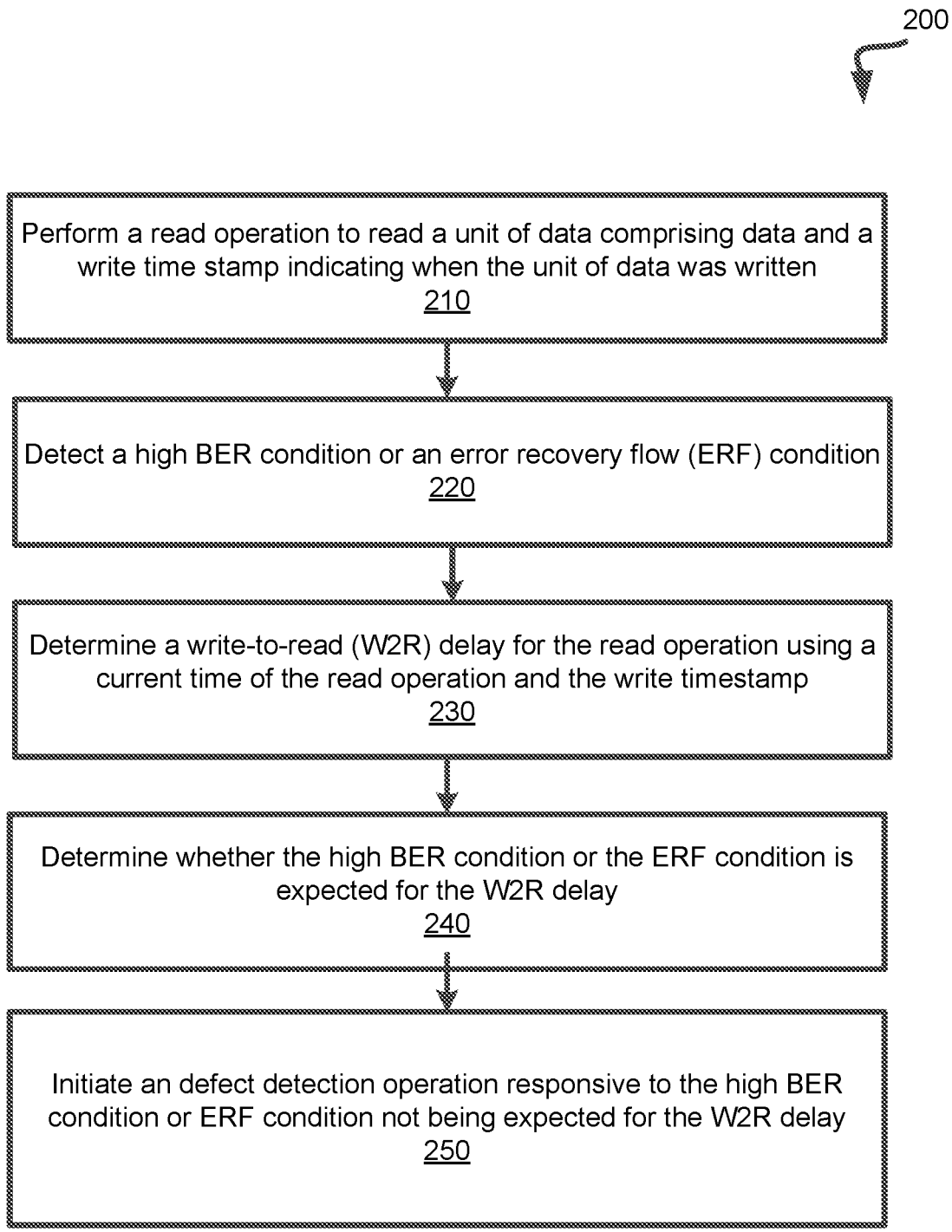
FIG. 2 is a flow diagram of an example method to initiate a defect detection operation to detect a defect in a memory component using a bit error rate (BER), corresponding to the read operation, or an error recover flow (ERF) indicator, and a write timestamp in accordance with some embodiments of the present disclosure.

FIG. 2 is a flow diagram of an example method 200 to initiate a defect detection operation to detect a defect in a memory component using a bit error rate (BER), corresponding to a read operation, or an ERF indicator, and a write timestamp in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the memory defect detection component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, the processing device performs a read operation to read a unit of data comprising data and a write timestamp indicating when the unit of data was written to the memory component. At operation 220, the processing device detects a high BER condition or an error recovery flow (ERF) condition. The high BER condition can be detected responsive to a BER, corresponding to the read operation, satisfying a BER threshold criterion. The ERF condition can be detected when an ERF is performed to recover the unit of data responsive to one or more errors being detected in the read operation. When the ERF is performed, there can be an indication that the ERF has been performed, such as an ERF indicator. The ERF indicator, representing the ERF being performed for the read operation, can serve as an indicator of a defect in the memory component. At operation 230, the processing device determines a write-to-read (W2R) delay for the read operation using a current time of the read operation and the write timestamp. At operation 240, the processing device determines whether the BER condition or the ERF condition is expected for the W2R delay. At operation 250, the processing device initiates the defect detection operation responsive to the BER condition, corresponding to an initial read voltage level of the read operation, or the ERF condition not being expected for the W2R delay. For example, as illustrated in FIG. 4, the processing device can store an expected range of BER within a specified range of W2R delays and the BER and the W2R, corresponding of the initial read operation, can be compared against the expected range of BER for the specified range of W2R delays to determine whether to initiate the defect detection operation. Responsive to the BER being higher than the expected range of BER and the W2R delay is within the range of W2R delays specified for the initial read voltage level, the defect detection operation is initiated. Responsive to the BER being within the expected range of BER or W2R delay is outside the range of W2R delays specified for the initial read voltage level, the defect detection operation is not initiated.

In a further embodiment, after the unit of data is recovered by the ERF, the processing device determines whether the BER satisfies a threshold criterion when the unit of data is read by the read operation with the initial read voltage level. The processing device initiates the defect detection operation to detect the defect in the memory component using the BER and the write timestamp responsive to the BER satisfying the threshold criterion. When the BER does not satisfy the threshold criterion, the processing device does not initiate the defect detection operation and the read operation is completed.

In another embodiment, after the unit of data is recovered, the processing device determines whether a re-read operation is performed in the ERF. The re-read operation is performed with a different read voltage level than an initial read voltage level used with the read operation before the ERF is performed. Responsive to the re-read operation being performed in the ERF, the processing device initiates the defect detection operation to detect the defect in the memory component using the ERF indicator and the write timestamp. If there is no re-read operation performed in the ERF, the processing device does not initiate the defect detection operation and the read operation is completed.

In another embodiment, the processing device determines whether the BER satisfies a threshold criterion when unit of data is read by the read operation with an initial read voltage level. The processing device determines whether a re-read operation is performed in the ERF. As noted above, the re-read operation is performed with a different read voltage level than the initial read voltage level. Responsive to the BER satisfying the threshold criterion and responsive to the re-read operation being performed in the ERF, the processing device initiates the defect detection operation to detect the defect in the memory component using the BER and the write timestamp. Responsive to the BER not satisfying the threshold criterion or no re-read operation being performed in the ERF, the processing device does not initiate the defect detection operation and the read operation is completed.

In another embodiment, the processing device performs a read operation with a first read voltage level on a set of memory cells to read the unit of data in the memory component before the ERF is performed. The processing device performs a re-read operation with a second read voltage level on the set of memory cells to recover the unit of data as part of the ERF. The second read voltage level is different than the first read voltage level. The processing device initiates the defect detection operation to detect the defect in the memory component after the unit of data is recovered.

In another embodiment, the processing device detects one or more errors in the unit of data read from a set of memory cells of the memory component using a default read voltage level. In response to detection of one or more errors in the unit of data, the processing device performs a re-read operation with a second read voltage level on the set of memory cells to recover the unit of data as part of the ERF. As noted above, the second read voltage level is different than the default read voltage level. The processing device initiates the defect detection operation to detect the defect in the memory component after the unit of data is recovered.

In another embodiment, the processing device receives a request to write data to a memory component. The processing device obtains a write timestamp and issues issue the write operation to write the data and the write timestamp as the unit of data in the memory component.

In another embodiment, the processing device obtains the write timestamp, obtains a write temperature value indicating a temperature when the unit of data was written. The processing device issues issue a write operation to write the data, the write timestamp, and the temperature value as the unit of data in the memory component. In other embodiments, additional metadata can be stored in connection with the write timestamp in the unit of data. The metadata can be used in connection with the defect detection operation.

In another embodiment, the processing device can determine to perform a defect detection operation even when a ERF is not performed. For example, the original read operation succeeds, but the processing device determines that the BER is higher than expected and the W2R is within the range of W2R delays specified for the initial read. In this case, the processing logic can perform the defect detection operation to detect a defect in the memory component.

In another embodiment, at operation 230, instead of using the BER and the write time stamp, the processing device can determine whether to perform a defect detection operation to detect a defect in the memory component using an indication of a ERF being performed as a result of an unsuccessful initial read operation and the W2R (based on the write timestamp in the unit of data) is within the range of W2R delays specified for the initial read.

Figure 3:
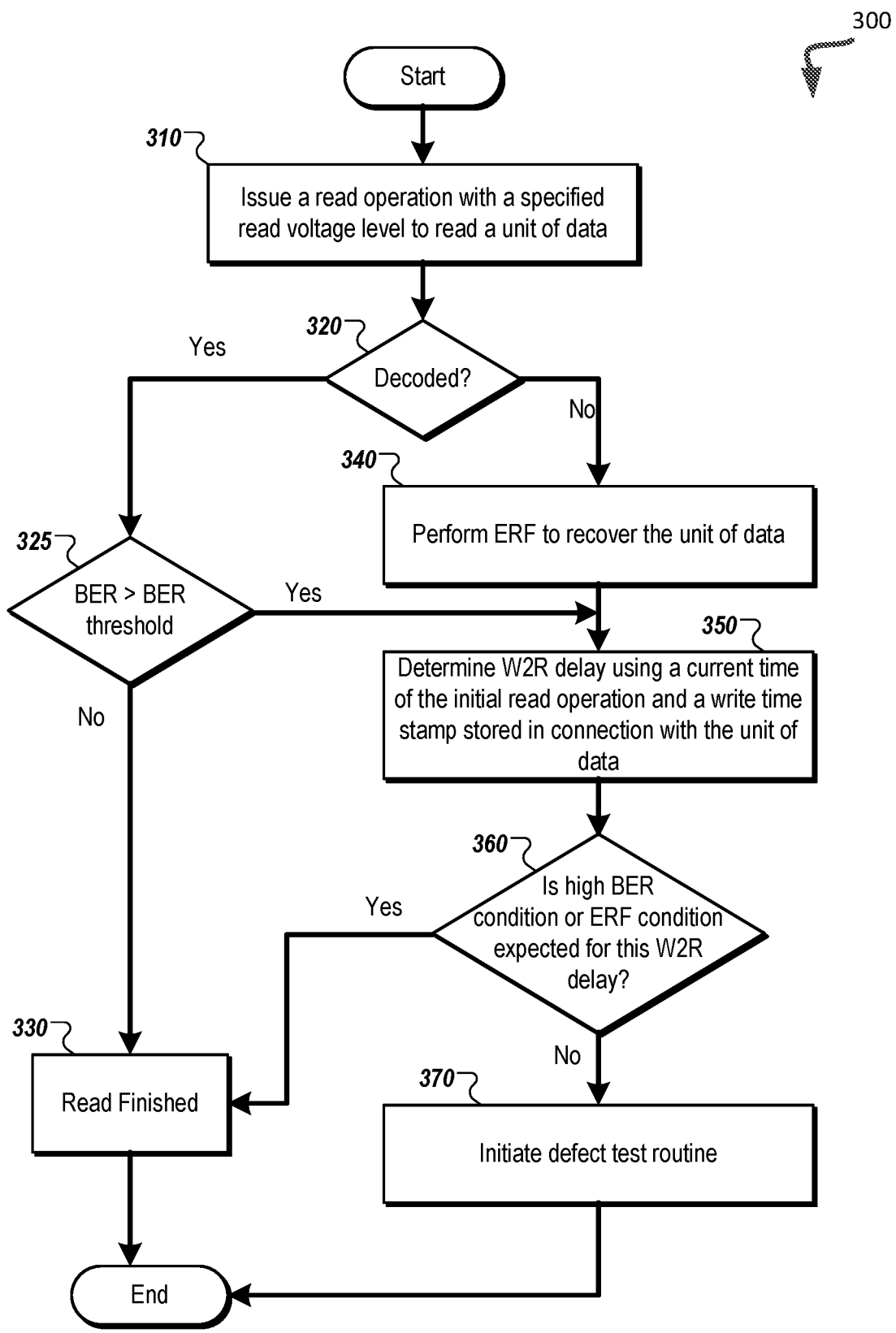
FIG. 3 is a flow diagram of an example method to determine whether a W2R delay is within a range of W2R delays specified for an initial read voltage level in accordance with some embodiments of the present disclosure.

FIG. 3 is a flow diagram of an example method 300 to determine whether a W2R delay is within a range of W2R delays specified for an initial read voltage level in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the memory defect detection component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the processing device issues a read operation with a specified read voltage level to read a unit of data in a memory component. At operation 320, the processing device determines whether the unit of data from the read operation is successfully decoded because of an error. When the processing device determines that the unit of data from the read operation is successfully decoded at operation 320, the processing device determines whether a bit error rate (BER) satisfies a BER threshold criterion when unit of data is read by the read operation with the specified read voltage level at operation 325. Responsive to the BER satisfying the BER threshold criterion at operation 325, the processing device determine a write-to-read (W2R) delay between the written timestamp and the original read operation at block 310 using a current time of the initial read operation and a write timestamp stored in connection with the unit of data at operation 350. At operation 360, the processing device determines whether such BER condition or ERF condition is expected for this W2R delay. Responsive to the BER condition or the ERF condition being expected at operation 360, the processing device completes the read operation at operation 360. Responsive to the BER condition or the ERF condition not being expected at operation 360, the processing device initiates a defect test routine at operation 370.

For example, the processing device at operation 360 determines whether the BER, corresponding to the read operation, is expected at this given W2R delay. Responsive to the given W2R delay is not within the range of W2R delays for the initial read voltage level at operation 360, the read operation is completed at operation 330. Responsive to the given W2R delay is within the range of W2R delays for the initial read voltage level at operation 360, the processing device initiates the defect test routine at operation 370. In particular, when the BER for the read operation is higher than a range of BER corresponding to a range of W2R delays specified for the specified read voltage level (i.e., a range of acceptable BER for a range of W2R delays as the BER threshold criterion) and the given W2R delay is within the range of W2R delays for the initial read voltage level, the defect test routine is initiated at operation 370.

For another example, the processing device at operation 360 determines whether a re-read operation is performed in the ERF at operation 340. The re-read operation is performed with a different read voltage level than the initial read voltage level used by the read operation at operation 310 before the ERF is performed. Responsive to the re-read operation being performed on the read operation and the given W2R delay is within the range of W2R delays for the initial read voltage level, the processing device initiates the defect test routine at operation 370.

Responsive to the BER not satisfying the BER threshold criterion at operation 325, the processing device completes the read operation at operation 330.

When the processing device determines that the unit of data from the read operation is not successfully decoded because of an error at operation 320, the processing device performs an error recovery flow (ERF) to recover the unit of data at operation 340. In some embodiments, during the ERF the processing device issues one or more re-read operations with one or more read voltage levels that are different from the specified read voltage level. After the ERF is performed at operation 340, at operation 350, the processing device determines the W2R delay for the read operation at operation 310 using a current time of the initial read operation and a write timestamp stored in connection with the unit of data when the unit of data was written. It should be noted that the W2R delay is between the written timestamp and the initial read at operation 310 and not any re-reads performed during the ERF at operation 340. As described above, at operation 360, the processing device determines whether the W2R delay is within a range of W2R delays specified for the specified read voltage level. Responsive to the W2R delay not being within the range of W2R delays at operation 360, the read operation is completed at operation 330. Responsive to the W2R delay being within the range of W2R delays at operation 360, the processing device initiates a defect test routine at operation 370. In particular, when the W2R delay for the read operation is within the range of W2R delays specified for the specified read voltage level and an ERF is performed at block 340, the defect test routine is initiated.

In another embodiment, the processing device obtains a write timestamp and issues a write operation to write the data and the write timestamp as the unit of data in the memory component. The processing device can obtain and write timestamps for each unit of data being written to the memory component. The write timestamp can be used to calculate W2R delays and can check the calculated W2R delays against a corresponding range for the default read voltage levels.

In another embodiment, the processing device also obtains temperature or other measurements at the time of the write operation and stores the temperature or other measurements as metadata in connection with the data. For example, a unit of data stores the data, the write timestamp and the temperature at the time the data is written to the memory component.

In one embodiment, the processing device determines whether a bit error rate (BER) satisfies a threshold criterion when unit of data is read by the read operation with the specified read voltage level. The processing device initiates the defect test routine responsive to the BER satisfying the threshold criterion and the W2R delay being within the range of W2R delays specified for the specified read voltage level.

In another embodiment, the processing device determines whether the re-read operation is performed in the ERF. The processing device initiates the defect test routine responsive to the re-read operation being performed in the ERF and the W2R delay being within the range of W2R delays specified for the specified read voltage level.

In another embodiment, the processing device determines both whether the BER of the initial read operation satisfies the threshold criterion and whether the re-read operation is performed in the ERF. The processing device initiates the defect test routine responsive to both conditions being met. In particular, the processing device determines whether a BER of the initial read operation satisfies a threshold criterion when unit of data is read by the read operation with the specified read voltage level. The processing device determines whether the re-read operation is performed in the ERF. The processing device initiates the defect test routine responsive to the BER satisfying the threshold criterion, the re-read operation being performed in the ERF, and the W2R delay being within the range of W2R delays specified for the specified read voltage level. In other embodiments, additional checks can be made against other metadata values stored in connection with the unit of data. For example, when a write temperature value is written in connection with the unit of data, the processing device can determine whether defect test routine should be performed or not based on considering both the W2R delay and the current/write temperature information.

In another embodiment, the processing device detects one or more errors in the unit of data read from the memory component using an initial read voltage level. In response to detection of one or more errors in the unit of data, the processing device performs the re-read operation with the different read voltage level to recover the unit of data as part of the ERF. The processing device initiates the defect test routine after the unit of data is recovered.

Figure 4A:
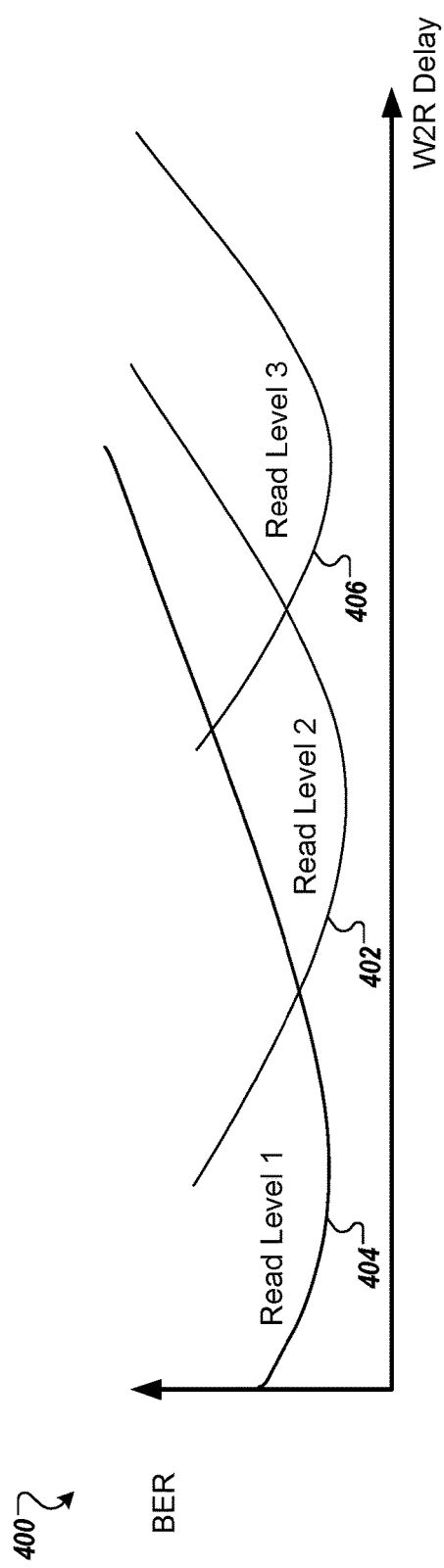
FIG. 4A is a graph that illustrates BER as a function of W2R delays for three read voltage levels a read voltage level in accordance with some embodiments of the present disclosure.

FIG. 4A is a graph 400 that illustrates BER as a function of W2R delays for three read voltage levels a read voltage level in accordance with some embodiments of the present disclosure. As described herein, Vt distributions can move as a function of time. For example, with a same read level, such as a second read level (labeled Read level 2) corresponding to an initial read voltage level (also referred to as a default read level), if the Vt distributions move, the bit error rate for this read voltage level changes as a function of time. Similarly, if Vt distributions move for a first read level, the bit error rate for this read voltage level changes as a function of time. Similarly, if Vt distributions move for a third read level, the bit error rate for this read voltage level changes as a function of time. The Vt distribution and bit error rate can be a function of W2R delay. Graph 400 shows a bit error rate curve 402 as a function of W2R delay corresponding to the second read level, a bit error rate curve 404 as a function of W2R delay corresponding to the first read level, and a bit error rate curve 406 as a function of W2R delay corresponding to the third read level. Due to the time-varying nature of BER, the single read level (default read level) is not sufficient to achieve best memory read BER for system reliability targets. For example, a single read level, e.g., read level 1, achieves low BER at short W2R delay but BER is high at high delay. As such, multiple read levels, such as the three read levels shown in FIG. 4A, are used to achieve low BER over a larger range of W2R delay. Using the embodiments described herein, the W2R delay can be measured using the write timestamp and a current time of the initial read operation to determine whether the measured W2R delay is within a range specified for a particular read level as shown and described with respect to FIG. 4B.

Figure 4B:
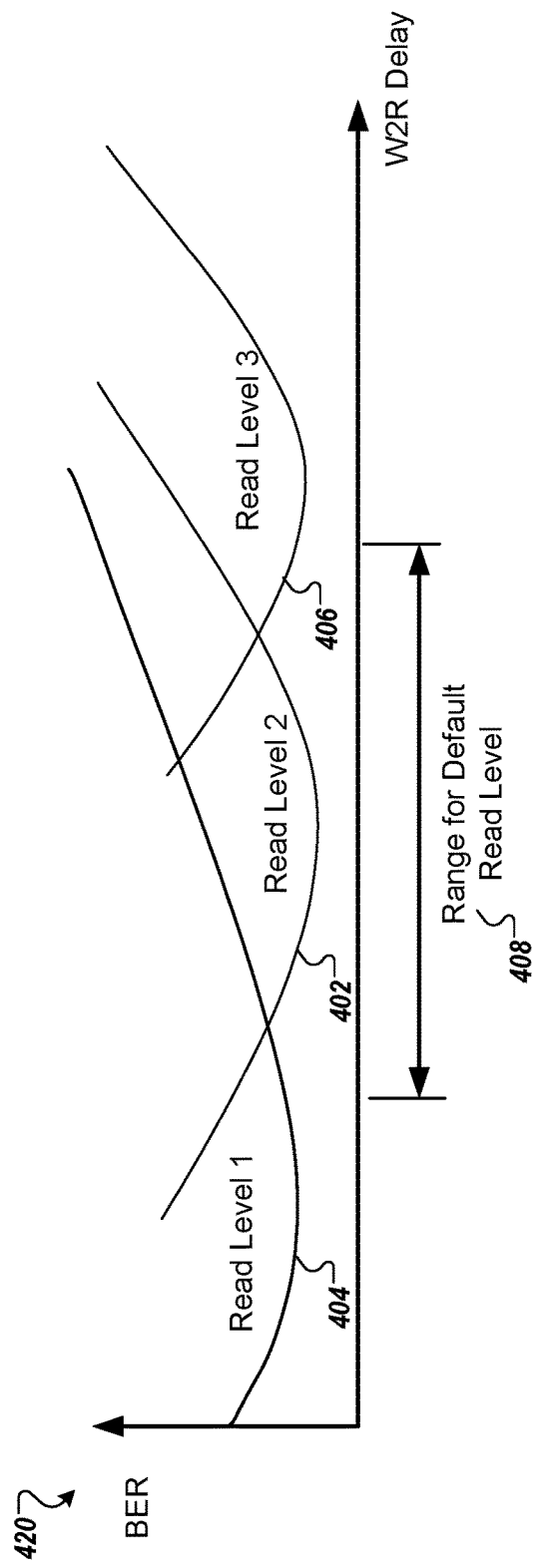
FIG. 4B is a graph that illustrates a W2R delay range, which is expected to achieve a good BER, for a default read level for one of three read voltage levels of FIG. 4A in accordance with some embodiments of the present disclosure.

FIG. 4B is a graph 420 that illustrates a W2R delay range 408 for a default read level for one of three read voltage levels of FIG. 4A in accordance with some embodiments of the present disclosure. If a read is performed at a certain W2R delay within 408, it is expected that a good BER should be achieved for this read. As described herein, every write unit of data is written to memory with a write timestamp when the write unit is written. Each read operation starts with a default read level. When there are uncorrectable errors then an error recovery flow is performed. During the error recovery flow, one or more re-read operations are performed with read levels that are different than the default read level. For example, as illustrated in FIG. 4B, the default read level is the second read level. The second read level has a bit error rate curve 402 as a function of W2R delay. If it is determined that the decoder statistics, such as BER, are high at the default read level, or if a re-read operation is triggered with a different read level, the processing device performs a check on the following criterion after the data and the corresponding write timestamp are recovered (i.e., successfully decoded with initial read or using the different read level in ERF). The check includes measuring a W2R delay for the initial read operation by taking a difference between a current time of the initial read operation and the write timestamp and comparing the W2R delay against a W2R delay range 408 specified for the default read level. If the W2R delay for the initial read operation falls in the W2R delay range 408, a defect test routine is triggered; otherwise, the defect test routine is not triggered. It should be noted that the W2R delay is measured for the initial read operation, not any re-read operations as part of the ERF.

In one embodiment, the processing device implements this check in a hardware circuit, including logic circuitry with at least one input being whether the W2R delay is within the W2R delay range 408. The logic circuitry can output an interrupt signal that causes the processing device to perform the defect test routine. In another embodiment, the processing device implements this check in firmware. The firmware calculates the W2R delay and determines if the W2R delay is within the W2R delay range 408. The firmware can initiate the defect test routine accordingly. In another embodiment, the processing device implements this check as a software routine that is executed in connection with read operations.

In another embodiment, the processing device can specify a range for each of the multiple read thresholds. In that manner, if the first read level is considered the default read level for the initial read operation, there can be a corresponding W2R delay range for the first read level. Similarly, if the third read level is considered the default read level for the initial read operation, there can be a corresponding W2R delay range for the third read level. It should also be noted that the processing device can include more or less read levels than three and there can be W2R delays for one or more of these multiple read levels.

In another embodiment, the write timestamp can be embedded with the data during memory write operations, and after each read operation with ERF, the processing device can determine whether to trigger the defect detection operation based on the combination of its W2R delay and other statistics, such as decoding history statistics (BER) of this data unit. In other embodiments, additional metadata can be stored along with the write timestamp. The additional metadata can impact BER, for example, and the additional metadata can be used in the check to determine whether to check for defects based on the different combinations of statistics, the additional metadata, and the write timestamp.

The embodiments described herein provide on-demand criterion that applies to every read operation. The embodiments effectively detect abnormal characteristics, such as high read bit error rate (RBER) events, and trigger defect detection responsive to the write timestamp falling within a specified range specified for a read voltage level used for the initial read operation. The embodiments can minimize false alarms and can reduce performance penalties caused by conventional defect management algorithms. The embodiments of the trigger criterion described herein can be simple and can be implemented in hardware without impacting system performance.

Figure 5:
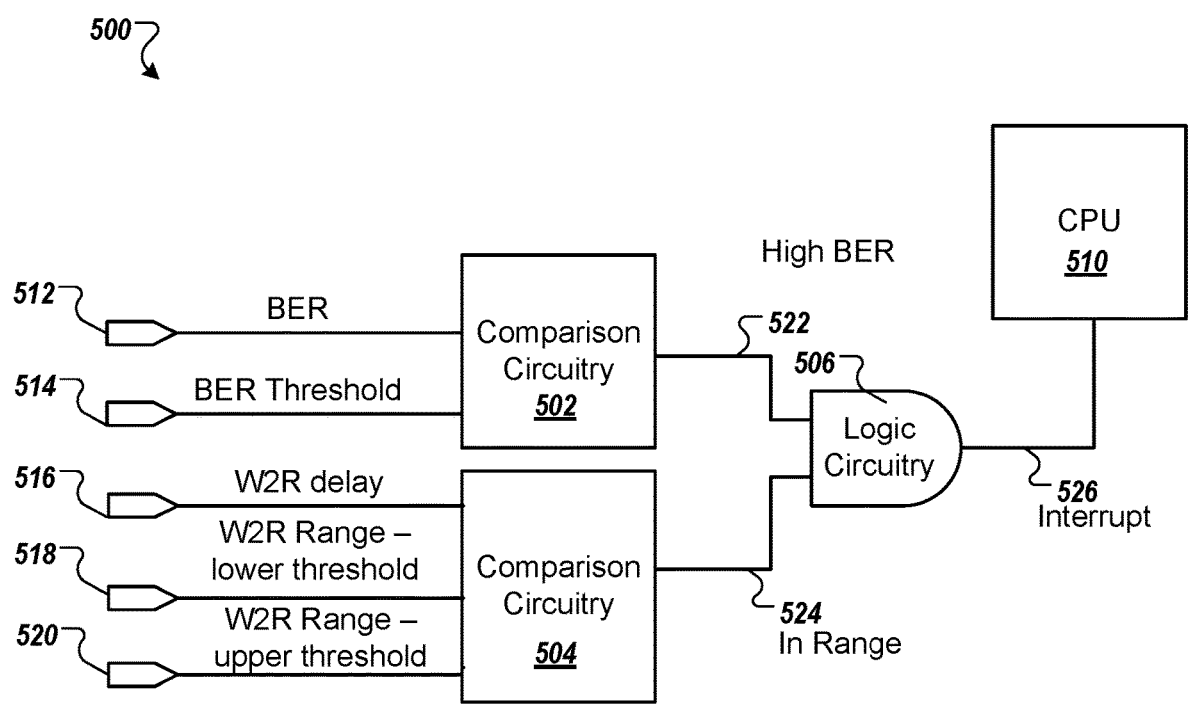
FIG. 5 is a block diagram of a hardware circuit that triggers a defect detection operation in a central processing unit (CPU) of a memory system in accordance with some embodiments of the present disclosure.

FIG. 5 is a block diagram of a hardware circuit 500 that triggers a defect detection operation in a central processing unit (CPU) 510 of a memory system in accordance with some embodiments of the present disclosure. The hardware circuit 500 includes first comparison circuitry 502, second comparison circuitry 504, and logic circuitry 506. The first comparison circuitry 502 can receive as inputs a first signal 512, indicative of a first statistic, such as BER or RBER, and a second signal 514, indicative of a first threshold, such as BER or RBER threshold. The first comparison circuitry 502 can include one or more comparators to compare the inputs. The first comparison circuitry 502 compares the inputs to generate a first output signal 522, indicative of an abnormal condition, such as high BER. The second comparison circuitry 504 can receive as inputs a third signal 516, indicative of a first timing statistic, such as W2R delay, a fourth signal 518, indicative of a lower threshold of a range, such as W2R delay lower threshold, and a fifth signal 520, indicative of an upper threshold of the range, such as W2R delay upper threshold. The second comparison circuitry 504 can include one or more comparators to compare the inputs. The second comparison circuitry 504 compares the inputs to generate a second output signal 524, indicative of the third signal 516 being within the range, such as within the W2R delay range. Logic circuitry 506 can receive the first output signal 522 and the second output signal 524, and based on the particular function of the logic circuitry, such an AND function, outputs an interrupt 526 to the CPU 510. The interrupt 526 can indicate that a defect detection operation should be performed.

In one embodiment, the interrupt 526 is the result of a BER for a read operation satisfies a BER threshold criterion and the W2R delay (based on the write timestamp) is within a W2R delay range. The hardware circuit 500 can include different logic and circuit components to determine the conditions for triggering the defect detection operation. For example, the inputs can include the write timestamp and a current time of the initial read operation to calculate the W2R delay before being compared against the W2R delay range. In other embodiments, the inputs can include other metadata such as temperature at the time the write unit is written to the memory component. Although the logic circuitry 506 is illustrated as a single AND gate in FIG. 5, in other embodiments, the logic circuitry 506 can include one or more logic gates that define a function to determine whether the defect detection operation is triggered or not. Also, as described herein, the functionality of the hardware circuit 500 can be implemented in firmware or software.

In another embodiment, similar comparison and logic circuitry could be used to detect the ERF condition and to generate an interrupt to the CPU 510 when the ERF condition is detected. Similarly, other comparison and logic circuitry could be used to detect other conditions as a function of the W2R delay and generate an interrupt to the CPU 510 when the other condition is detected.

Figure 6:
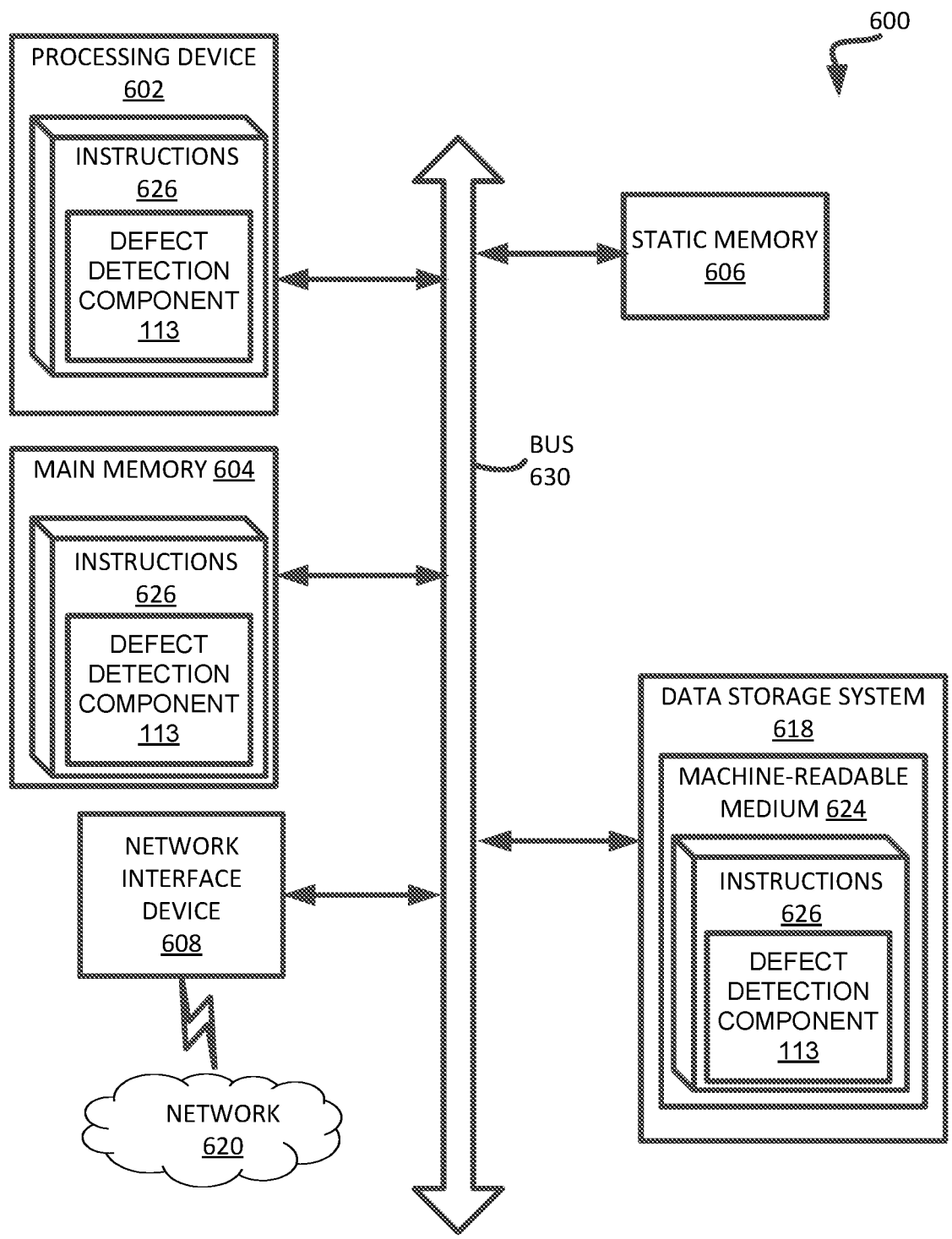
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the defect detection component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable storage medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to an ERF component (e.g., the defect detection component 113 of FIG. 1). While the machine-readable storage medium 624 is shown in an example embodiment to be a single medium, the term "machine-readable storage medium" or "computer-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory component; and
a processing device, operatively coupled with the memory component, to perform operations comprising:
determining that a bit error rate (BER) condition corresponding to a read operation to read a unit of data in a memory component satisfies a threshold criterion;

determining a write-to-read (W2R) delay for the read operation, wherein the W2R delay comprises a difference between a time of the read operation and a write timestamp indicating when the unit of data was written to the memory component;

determining whether the W2R delay is within a W2R delay range corresponding to an initial read voltage level used by the read operation to read the unit of data; and initiating a defect detection operation responsive to the W2R delay being within the W2R delay range, the defect detection operation to detect time-varying defects in the memory component.

2. The system of claim 1, wherein the operations further comprise:

performing, at a current time, the read operation to read the unit of data comprising data and the write timestamp indicating when the unit of data was written to the memory component; and determining whether an error recovery flow (ERF) condition is detected, wherein the ERF condition is detected responsive to an ERF being performed to recover the unit of data responsive to one or more errors being detected in the read operation.

3. The system of claim 1, wherein the operations further comprising:

responsive to the BER satisfying the threshold criterion, initiating the defect detection operation to detect a defect in the memory component.

4. The system of claim 2, wherein the operations further comprising:

determining whether a re-read operation is performed in the ERF, wherein the re-read operation is performed with a different read voltage level than an initial read voltage level used by the read operation before the ERF is performed; and responsive to the re-read operation being performed in the ERF, initiating the defect detection operation to detect a defect in the memory component.

5. The system of claim 2, wherein the operations further comprise:

determining whether the BER satisfies the threshold criterion when the unit of data is read by the read operation with an initial read voltage level;

determining whether a re-read operation is performed in the ERF, wherein the re-read operation is performed with a different read voltage level than the initial read voltage level; and responsive to the BER satisfying the threshold criterion and responsive to the re-read operation being performed in the ERF, initiating the defect detection operation to detect a defect in the memory component.

6. The system of claim 2, wherein the operations further comprise:

performing the read operation with the initial read voltage level on a plurality of memory cells to read the unit of data in the memory component before the ERF is performed;

performing a re-read operation with a second read voltage level on the plurality of memory cells to recover the unit of data as part of the ERF, wherein the second read voltage level is different than the initial read voltage level; and initiating the defect detection operation to detect a defect in the memory component after the unit of data is recovered.

7. The system of claim 2, wherein the operations further comprise:

detecting the one or more errors in the unit of data read from a plurality of memory cells of the memory component using the initial read voltage level; and in response to detection of one or more errors in the unit of data, performing a re-read operation with a second read voltage level on the plurality of memory cells to recover the unit of data as part of the ERF, wherein the second read voltage level is different than the initial read voltage level; and initiating the defect detection operation to detect a defect in the memory component after the unit of data is recovered.

8. The system of claim 2, wherein the operations further comprise:

obtaining the write timestamp; and issuing a write operation to write the data and the write timestamp as the unit of data in the memory component.

9. A method comprising:

determining that a bit error rate (BER) condition corresponding to a read operation to read a unit of data in a memory component satisfies a threshold criterion;

determining a write-to-read (W2R) delay for the read operation, wherein the W2R delay comprises a difference between a time of the read operation and a write timestamp indicating when the unit of data was written to the memory component;

determining whether the W2R delay is within a W2R delay range corresponding to an initial read voltage level used by the read operation to read the unit of data; and initiating a defect detection operation responsive to the W2R delay being within the W2R delay range, the defect detection operation to detect time-varying defects in the memory component.

10. The method of claim 9, further comprising:

performing, at a current time, the read operation to read the unit of data comprising data and the write timestamp indicating when the unit of data was written to the memory component; and determining whether an error recovery flow (ERF) condition is detected, wherein the ERF condition is detected responsive to an ERF being performed to recover the unit of data responsive to one or more errors being detected in the read operation.

11. The method of claim 9, further comprising:

responsive to the BER satisfying the threshold criterion, initiating the defect detection operation to detect a defect in the memory component.

12. The method of claim 10, further comprising:

determining whether a re-read operation is performed in the ERF, wherein the re-read operation is performed with a different read voltage level than an initial read voltage level used by the read operation before the ERF is performed; and responsive to the re-read operation being performed in the ERF, initiating the defect detection operation to detect a defect in the memory component.

13. The method of claim 10, further comprising:

determining whether the BER satisfies the threshold criterion when the unit of data is read by the read operation with an initial read voltage level;

determining whether a re-read operation is performed in the ERF, wherein the re-read operation is performed with a different read voltage level than the initial read voltage level; and responsive to the BER satisfying the threshold criterion and responsive to the re-read operation being performed in the ERF, initiating the defect detection operation to detect a defect in the memory component.

14. The method of claim 10, further comprising:

performing the read operation with the initial read voltage level on a plurality of memory cells to read the unit of data in the memory component before the ERF is performed;

performing a re-read operation with a second read voltage level on the plurality of memory cells to recover the unit of data as part of the ERF, wherein the second read voltage level is different than the initial read voltage level; and initiating the defect detection operation to detect a defect in the memory component after the unit of data is recovered.

15. The method of claim 10, further comprising:

detecting the one or more errors in the unit of data read from a plurality of memory cells of the memory component using the initial read voltage level; and in response to detection of one or more errors in the unit of data, performing a re-read operation with a second read voltage level on the plurality of memory cells to recover the unit of data as part of the ERF, wherein the second read voltage level is different than the initial read voltage level; and initiating the defect detection operation to detect a defect in the memory component after the unit of data is recovered.

16. The method of claim 10, further comprising:

obtaining the write timestamp; and issuing a write operation to write the data and the write timestamp as the unit of data in the memory component.

17. The method of claim 10, further comprising:

obtaining the write timestamp;

obtaining a write temperature value indicating a temperature when the unit of data was written; and issuing a write operation to write the data, the write timestamp, and the temperature value as the unit of data in the memory component.

18. A non-transitory computer-readable storage medium comprising instructions that, when executed by a processing device, cause the processing device to perform operations comprising:

determining that a bit error rate (BER) condition corresponding to a read operation to read a unit of data in a memory component satisfies a threshold criterion;

determining a write-to-read (W2R) delay for the read operation, wherein the W2R delay comprises a difference between a time of the read operation and a write timestamp indicating when the unit of data was written to the memory component;

determining whether the W2R delay is within a W2R delay range corresponding to an initial read voltage level used by the read operation to read the unit of data; and initiating a defect detection operation responsive to the W2R delay being within the W2R delay range, the defect detection operation to detect time-varying defects in the memory component.

19. The non-transitory computer-readable storage medium of claim 18, the operations further comprising:

performing, at a current time, the read operation to read the unit of data comprising data and the write timestamp indicating when the unit of data was written to the memory component; and determining whether an error recovery flow (ERF) condition is detected, wherein the ERF condition is detected responsive to an ERF being performed to recover the unit of data responsive to one or more errors being detected in the read operation.

20. The non-transitory computer-readable storage medium of claim 18, the operations further comprising:

responsive to the BER satisfying the threshold criterion, initiating the defect detection operation to detect a defect in the memory component.

* * * * *